United States Patent [19]

Dubots et al.

[11] Patent Number: 4,954,479
[45] Date of Patent: Sep. 4, 1990

[54] COMPOSITE SUPERCONDUCTING STRAND HAVING A HIGH CRITICAL TEMPERATURE, AND METHOD OF MANUFACTURE

[75] Inventors: Patrick Dubots, Neauphle le Chateau; Denis Legat, Lisses, both of France

[73] Assignee: Societe Anonyme dite:Alsthom, Paris, France

[21] Appl. No.: 279,166

[22] Filed: Dec. 2, 1988

[30] Foreign Application Priority Data

Dec. 2, 1987 [FR] France .................. 87 16720

[51] Int. Cl.$^5$ ............................................. H01B 13/00
[52] U.S. Cl. .................................... 505/1; 29/599; 174/125.1; 505/887
[58] Field of Search ............... 174/125.1; 29/599; 505/704, 740, 884, 887

[56] References Cited

FOREIGN PATENT DOCUMENTS 285169 10/1988 European Pat. Off. ........... 29/599
310182  4/1989 European Pat. Off. ........... 29/599

OTHER PUBLICATIONS

Jin, S. et al.; High Tc Superconductors-Composite Wire and Coil Fabrication; Appl. Phys. Lett., vol. 51, No. 29; Jul. 1987.
Glowacki et al.; External and Internal Diffusion of Oxygen in Superconducting $YBa_2Cu_3O_7$ Composite Conductors; Materials Research Society; Syposium High-Temperature Superconductors; vol. 99; Nov.–Dec. 1987.
Kohno, O. et al.; Characteristics of High–Tc Oxide Wire; Physical B+C Europhysics Journal; Proceedings of Yamada Conference XVIII; Japan; Aug.-Sept. 1987.
McCallium, R. W. et al.; Problems in the Production of $YBa_2Cu_3O_x$ Superconducting Wire; Advanced Ceramic Materials, vol. 2, No. 3B; Special Issue 1987; 388–400.
Jin, S. et al.; High Tc Superconductors Composite Wire Fabrication; Appl. Phys. Lett 51(3); Jul. 20, 1987; 203–204.

Primary Examiner—Morris H. Nimmo
Attorney, Agent, or Firm—Sughrue, Mion, Zinn, Macpeak & Seas

[57] ABSTRACT

A superconducting strand comprises a central superconducting filament (1), a covering (2) of oxide for ensuring sufficient oxygen pressure around the filament (1), a layer of cladding (3) made of aluminum, an alloy of copper and aluminum, or of stainless steel, a layer of cladding (4) made of niobium, of tantalum, or of vanadium, and an outer covering of copper (5).

2 Claims, 1 Drawing Sheet

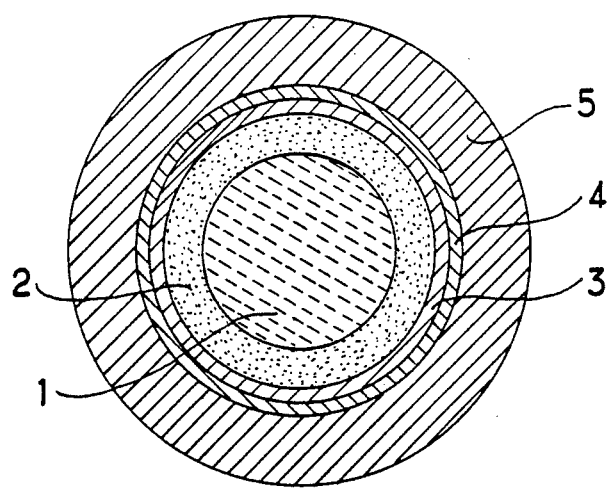

COMPOSITE SUPERCONDUCTING STRAND HAVING A HIGH CRITICAL TEMPERATURE, AND METHOD OF MANUFACTURE

The present invention relates to a composite superconducting strand having a high critical temperature, and to a method of manufacturing such a strand.

BACKGROUND OF THE INVENTION

A superconducting strand is generally constituted by:
one or more filaments (up to several hundreds of thousands) of superconducting material; and
a matrix of "normal" metal in which the superconducting filaments are embedded.

This matrix is generally made of copper or aluminum and it serves several functions:
stabilizing the superconductor: to do this, the material of the matrix must have increasing thermal and electrical conductivity for increasing filament size; and
providing mechanical strength to the strand when the strand is subjected to electromagnetic forces.

The forming of new high critical temperature superconducting materials having a high critical temperature into wires poses special problems. These materials are oxides, e.g. $YBa_2Cu_3O_{7-y}$, and they are therefore not deformable. They can be formed only when in the powder state, as is true for other superconductors, for example compounds of the "Chevrel phase" type described in French patent No. 2,553,565, dated Oct. 18, 1983.

In addition, the superconducting properties of these oxides are highly sensitive to their environment, in particular their oxygen environment, and the sintering of the powder which is required in order to provide electrical continuity between the grains must be performed in an oxidizing atmosphere. If the powder is enclosed in a metal sheath, it is not possible to provide the required oxygen environment.

Further, it is not possible to use copper as the matrix material since in the oxide state it reacts with the superconducting oxide to form phases which are more stable but not superconducting. For example, when using $YBa_2Cu_3O_{7-y}$, the decomposition products are $Y_2BaCuO_5$ and $BaCu_2O$.

Two solutions have already been proposed to these problems.

In the first case, a filament of superconducting oxide is made in a matrix of copper or copper alloy (e.g. CuNi), and then after the sintering heat treatment, the copper matrix is dissolved so as to leave the oxide filaments in the presence of oxygen.

Heretofore, the matrix has been dissolved in order to seek maximum current transport capacity in the superconducting filament. Although this method has been tested on short lengths of filament, it is not suitable for being industrialized. Firstly, the absence of copper means that the functions of thermodynamic stabilization and of mechanical strength for the filament are no longer provided. Secondly, industrial manufacture would require long lengths of copper to be dissolved and this would give rise to problems in maintaining the mechanical integrity of the superconducting material prior to sintering.

The second case has been investigated more thoroughly, and it uses a matrix made of silver. In addition to its high cost, silver is not mechanically strong; further, it appears that silver degrades the superconducting properties of the filament. This solution is therefore not suitable for major industrial development.

The object of the present invention is to provide a composite superconducting strand having a high critical temperature and whose structure is such as to be capable of being manufactured industrially.

SUMMARY OF THE INVENTION

The present invention provides a composite superconducting strand having a high critical temperature comprising a filament of sintered superconducting oxide powder and an outer covering of copper, and additionally comprising around said filament, and in order:

an inner covering of an oxide which is inert relative to said superconducting oxide and which is selected in such a manner as to ensure sufficient oxygen partial pressure around said filament for the oxygen of the superconducting oxide to be maintained therein;

a first layer of cladding made of a material which is poorly permeable to oxygen; and a second layer of cladding made of a material acting as a diffusion barrier to the copper of said outer covering.

The oxide of said inner covering is selected from: an oxide of barium, alumina, and oxide of lead, $Ag_2O$ or $Ag_2O_2$ silver oxide, magnesia, zirconia, ytrium zirconium oxide, calcium oxide, and an oxide of the type $Y_2BaCuO_3$, on their own or mixed together.

The material of said first layer of cladding is selected from aluminum, an alloy of copper and aluminum, and stainless steel.

Said second layer of cladding is made of a material selected from niobium, tantalum, and vanadium.

The present invention also provides a method of manufacturing such a composite superconducting strand, in which:

a rod is made of said superconducting oxide powder by isostatic compacting, and then a tube is made of said inert oxide powder by isostatic compacting;

an assembly is then built up comprising, in order, said rod, said tube, a tube of material for said first layer of cladding, a tube of material for said second layer of cladding, and a tube of copper;

drawing and wire-drawing operations are performed; and said superconducting powder is sintered.

Preferably:

a rod is made by isostatically compacting $YBa_2Cu_3O_{7-y}$, and a tube is formed by isostatically compacting alumina or barium oxide;

an assembly is then built up comprising, in succession, said rod, said tube, a tube of aluminum, a tube of niobium, and a tube of copper;

drawing and wire-drawing operations are then performed; and said $YBa_2Cu_3O_{7-y}$ powder is then sintered.

In order to obtain a multifilament strand, a plurality of monofilament strands obtained as described above are stacked together.

BRIEF DESCRIPTION OF THE DRAWING

An embodiment of the invention is described by way of example with reference to the accompanying drawing, in which the sole figure is a highly diagrammatic cross-section through a strand in accordance with the invention.

MORE DETAILED DESCRIPTION

The elementary strand visible in FIG. 1 comprises a central filament 1 based on a sintered powder of superconducting $YBa_2Cu_3O_{7-y}$ oxide surrounded by a plurality of layers of cladding. To begin with there is a covering 2 based on barium oxide powder which is chemically inert relative to the superconducting oxide. This may be BaO or $BaO_2$. This oxide is stable up to temperatures of about 800° C. Its function is to maintain sufficient oxygen pressure around the filament 1 regardless of temperature, and in particular while the superconducting powder is being sintered.

The inner covering 2 is surrounded by a layer of aluminum cladding 3 which forms a very thin film of alumina on contact with the covering 2, which film is highly impervious to oxygen, thereby confining the oxygen around the filament 1.

An outer covering of copper 5 is intended to provide thermodynamic stabilization for the strand, and between said outer covering and the aluminum cladding 3, there is a layer of niobium cladding 4 which acts as an anti-diffusion barrier to prevent the copper from diffusing towards the superconducting filament 1.

In order to make the above-described monofilament strand, the following procedure is used:

a rod is made of superconducting $YBa_2Cu_3O_{7-y}$ oxide powder by isostatic compacting;

a tube is made from barium oxide powder by isostatic compacting; and the assembly constituted by the rod and the tube mentioned above is then mounted in an aluminum tube, in a niobium tube, and then in a copper tube.

By way of example:

the rod may have a diameter of 5 mm;

the oxide tube may have a wall thickness of 1 mm;

the aluminum tube may have a wall thickness of 1 mm; and the niobium tube may have a wall thickness of 0.5 mm.

Drawing and wire-drawing is then performed using conventional methods as described, for example, in French patent No. 2,543,741.

Finally, the superconducting powder is heated to a temperature of about 900° C. to 950° C. The filament strand obtained in high way has a diameter of about 0.3 mm. It may be used to build up a multifilament strand merely by stacking up a large number of monofilament strands.

Naturally, the invention is not limited to the embodiment described above. Any of the items mentioned may be replaced by equivalent items. Thus, the oxide of the covering 2 may decompose during sintering into an oxide having a lowered degree of oxidation, with the released oxygen serving to stabilize the superconducting oxide. In addition to alumina, it is possible to use a lead oxide such as $PbO_2$, PbO, or $Pb_3O_4$, a silver oxide such as $Ag_2O$ or $Ag_2O_2$, magnesium, zirconia, yttrium zirconium oxide, calcium oxide $CaO_2$, or an oxide of the type $Y_2BaCuO_3$. The oxide may be used on its own or mixed with at least one other oxide. For example, barium oxide may be mixed with magnesia or even with a superconducting oxide.

Using oxides having a low decomposition temperature, such as oxides of lead or of silver, has the advantage of forming a metal layer after decomposition for ensuring electrical connection between the superconductor and its outer covering.

The cladding 3 is preferably made of aluminum which is a very ductile material, but it could be made of stainless steel, or of an alloy of copper and aluminum having a copper content, for example, lying in the range 4% to 9% by weight of aluminum. The niobium in the cladding 4 may be replaced by tantalum or by vanadium.

Other methods may be implemented for making the rod and the tube of oxide which surrounds it.

However, in any event, the arrangement of the invention ensures impermeability relative to the oxygen in the superconducting material: it makes it possible to protect said oxygen from contamination via the outer convering while maintaining sufficient oxygen partial pressure and optionally even supplying oxygen.

We claim:

1. A composite superconducting strand having a high critical temperature comprising a filament of sintered powder of superconducting oxide and an outer covering of copper, and additionally comprising around said filament, and in order:

an inner covering or an metallic oxide which is inert relative to said superconducting oxide and which is selected in such a manner as to ensure sufficient oxygen partial pressure around said filament for the oxygen of the superconducting oxide to be maintained therein;

a first layer of cladding made of a material which is poorly permeable to oxygen and which is selected from the group consisting of aluminum, an alloy of copper and aluminum, and stainless steel; and a second layer of cladding made of a material acting as a diffusion barrier to the copper of said outer covering and is selected from the group consisting of niobium, tantalum and vanadium.

2. A superconducting composite strand according to claim 1, wherein the oxide of said inner covering is selected from the group consisting of: an oxide of barium, alumina, an oxide of silver, e.g. $Ag_2O$ or $Ag_2O_2$, magnesia, zirconia, yttrium zirconium oxide, calcium oxide, and an oxide of the type $Y_2BaCuO_3$, on their own or mixed together.

* * * * *